(12) United States Patent
Mulfinger et al.

(10) Patent No.: US 12,446,307 B2
(45) Date of Patent: Oct. 14, 2025

(54) STRUCTURE AND METHOD OF FORMING SPACERS ON UNFACETED RAISED SOURCE/DRAIN REGIONS

(71) Applicant: GlobalFoundries U.S. Inc., Malta, NY (US)

(72) Inventors: George R. Mulfinger, Wilton, NY (US); Md Nasir Uddin Bhuyian, Cohoes, NY (US); Shesh Mani Pandey, Saratoga Springs, NY (US); Adam S. Rosenfeld, Ballston Spa, NY (US); Selina A. Mala, Ballston Spa, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 596 days.

(21) Appl. No.: 17/732,601

(22) Filed: Apr. 29, 2022

(65) Prior Publication Data

US 2023/0352348 A1 Nov. 2, 2023

(51) Int. Cl.
*H10D 86/01* (2025.01)
*H10D 62/10* (2025.01)
*H10D 62/13* (2025.01)
*H10D 64/01* (2025.01)
*H10D 86/00* (2025.01)

(52) U.S. Cl.
CPC ........... *H10D 86/01* (2025.01); *H10D 62/116* (2025.01); *H10D 62/151* (2025.01); *H10D 64/018* (2025.01); *H10D 64/021* (2025.01); *H10D 86/201* (2025.01)

(58) Field of Classification Search
CPC ............ H01L 29/6656; H01L 27/1203; H01L 29/6653; H01L 29/66553; H01L 21/76264–76291; H10D 62/116; H10D 64/021; H10D 30/0275; H10D 30/673; H10D 84/0128; H10D 84/0167; H10D 30/0218; H10D 30/022; H10D 30/601–608; H10D 30/6715–6721; H10D 62/151; H10D 86/201; H10D 86/01
See application file for complete search history.

(56) References Cited

U.S. PATENT DOCUMENTS

| | | | |
|---|---|---|---|
| 7,405,131 B2 | 7/2008 | Chong et al. | |
| 7,759,206 B2 | 7/2010 | Luo et al. | |
| 9,412,589 B2 | 8/2016 | Barge et al. | |
| 9,472,642 B2 | 10/2016 | Hoentschel et al. | |
| 2006/0121681 A1 | 6/2006 | Nadakumar | |
| 2007/0235802 A1 | 10/2007 | Chong et al. | |
| 2013/0320449 A1 | 12/2013 | Hoentschel et al. | |

(Continued)

*Primary Examiner* — Julio J Maldonado
*Assistant Examiner* — Paul A Berry
(74) *Attorney, Agent, or Firm* — Yee Tze Lim; Hoffman Warnick LLC

(57) ABSTRACT

Disclosed are a semiconductor structure and method of forming the structure. The structure has a semiconductor layer. A gate structure is located on the semiconductor layer. The gate structure has a sidewall spacer having a first section on the semiconductor layer and positioned laterally adjacent to the gate structure and further having a second section above and wider than the first section and positioned laterally adjacent the gate structure. A source/drain region is on the semiconductor layer and positioned laterally adjacent to the first section and the second section of the sidewall spacer.

20 Claims, 18 Drawing Sheets

(56) References Cited

U.S. PATENT DOCUMENTS

| | | |
|---|---|---|
| 2013/0320450 A1 | 12/2013 | Hoentschel et al. |
| 2016/0056261 A1 | 2/2016 | Thees et al. |
| 2017/0170291 A1 | 6/2017 | Mulfinger et al. |
| 2017/0330953 A1* | 11/2017 | Mulfinger ............ H10D 84/017 |
| 2019/0305119 A1 | 10/2019 | John et al. |
| 2020/0144365 A1* | 5/2020 | Mulfinger .............. H10D 84/85 |
| 2021/0280694 A1 | 9/2021 | Su et al. |

* cited by examiner

STRUCTURE AND METHOD OF FORMING SPACERS ON UNFACETED RAISED SOURCE/DRAIN REGIONS

BACKGROUND

Field of the Invention

The present invention relates to semiconductor structures and, more particularly, to methods of forming spacers on field effect transistors (FETs).

Description of Related Art

Key factors considered in modern integrated circuit design include, but are not limited to, performance improvement, size scaling, and power consumption. Oftentimes design changes with respect to one of these factors can result in an undesirable trade-off with respect to one or more of the other factors. For example, complementary metal oxide semiconductor (CMOS) designs have been developed using advanced semiconductor-on-insulator processing technology platforms (e.g., a fully depleted silicon-on-insulator (FDSOI) processing technology platform), which include ultra-thin semiconductor and insulator layers (e.g., silicon and buried oxide layers) stacked on a base semiconductor substrate (e.g., a silicon substrate). Advantages of such designs include, but are not limited to, field effect transistor (FET) size scaling and optional back gate biasing to improve performance (e.g., forward back-biasing (FBB) or reverse back-biasing (RBB) for fine tuning FET threshold voltages (Vts)). However, due to increased resistance from the ultra-thin semiconductor layer, raised source/drain regions are necessary to boost saturation current. Unfortunately, the raised source/drain regions result in a corresponding performance-degrading increase in overlap capacitance (Coy) between the raised source/drain regions and the gate structure.

SUMMARY

In view of the foregoing, disclosed herein are embodiments of a semiconductor structure including a planar semiconductor-on-insulator field effect transistor (FET) with raised source/drain sections and sidewall spacers having a thicker spacer at the top sidewall and a thinner spacer at the bottom sidewall. The FET can include a channel region positioned laterally between source/drain regions. The close proximity between source/drain regions at the bottom provides performance enhancement of the FET while the further spacing at the top reduces overlap capacitance (Coy). Also disclosed herein are method embodiments for forming the above-described semiconductor structure embodiments.

More particularly, disclosed herein are embodiments of a semiconductor structure including a semiconductor-on-insulator field effect transistor (FET) configured for enhanced performance.

Further disclosed herein are embodiments of a method of forming a spacer adjacent to a gate of a transistor (e.g., PFET or NFET) having a thicker spacer near an upper portion of the gate and a thinner spacer near a lower portion of the gate. An epitaxial silicon layer (e.g., raised source/drain epi) may be formed closer to the lower portion of the gate, resulting in performance enhancement while the thicker spacer near the upper portion of the gate keeps the epitaxial silicon layer further from the gate, reducing overlap capacitance (Coy). In the method, a spacer is formed along a sidewall of the gate and a bottom portion of the spacer is removed to provide a larger area for the epitaxial silicon for the source/drain regions to grow near the lower portion of the gate/gate spacer.

According to an exemplary embodiment herein, a structure has a semiconductor layer. A gate structure is located on the semiconductor layer. The gate structure has a sidewall spacer having a first section on the semiconductor layer and positioned laterally adjacent to the gate structure and further having a second section above and wider than the first section and positioned laterally adjacent the gate structure. A source/drain region is on the semiconductor layer and positioned laterally adjacent to the first section and the second section of the sidewall spacer.

According to another exemplary embodiment herein, a substrate has a gate structure thereon. The substrate can be a semiconductor-on-insulator substrate. The gate structure has a bottom section contacting the substrate and a top section remote from the substrate. A sidewall spacer is on a sidewall of the gate structure and extends above the substrate. Portions of the sidewall spacer contacting the bottom section of the gate structure are thinner than portions of the sidewall spacer contacting the top section of the gate structure. Source and drain regions are located on a surface of the substrate adjacent to and contacting the sidewall spacer.

According to an exemplary method herein, a gate structure is formed on a semiconductor layer. A sidewall spacer is formed on the gate structure such that the sidewall spacer has a first section on the semiconductor layer and positioned laterally adjacent to the gate structure and the sidewall spacer has a second section above and wider than the first section and positioned laterally adjacent the gate structure. A source/drain region is formed on the semiconductor layer and positioned laterally adjacent to the first section and the second section of the sidewall spacer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
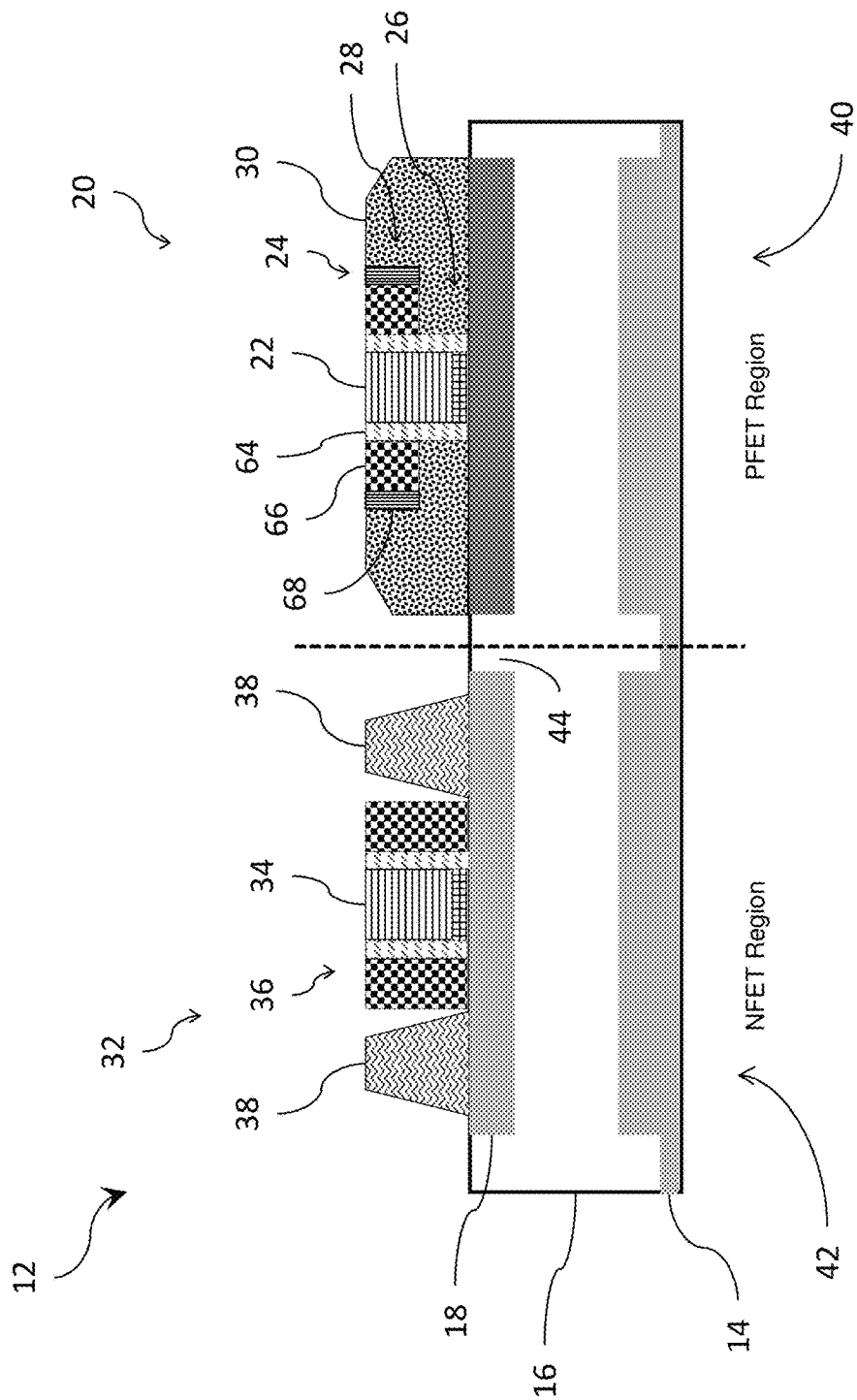
FIG. 1 is a cross-section diagram illustrating a semiconductor structure embodiment including a semiconductor-on-insulator field effect transistor (FET)

The present disclosure relates to semiconductor structures and, more particularly, to spacers for unfaceted epitaxial source/drain regions and methods of manufacture. Advantageously, the present disclosure provides gate-to-source/drain capacitance (Coy) reduction from faceted epitaxial regions.

The disclosure will now be described with reference to structures and methods of forming specifically shaped spacers to reduce capacitance on unfaceted raised source/drain regions of field effect transistors. While the disclosure will be described hereinafter in connection with specific devices and methods thereof, it will be understood that limiting the disclosure to such specific devices and methods is not intended. On the contrary, it is intended to cover all alternatives, modifications, and equivalents as may be included within the spirit and scope of the disclosure as defined by the appended claims.

For a general understanding of the features of the disclosure, reference is made to the drawings. The drawings are not to scale; however, in the drawings, like reference numerals have been used throughout to identify identical elements.

It will be readily understood that the devices and methods of the present disclosure, as generally described and illustrated in the drawings herein, may be arranged and designed in a wide variety of different configurations in addition to the devices and methods described herein. Thus, the following detailed description of the devices and methods, as represented in the drawings, is not intended to limit the scope defined by the appended claims but is merely representative of selected devices and methods. The following description is intended only by way of example, and simply illustrates certain concepts of the devices and methods, as disclosed and claimed herein.

Some advantages of complementary metal oxide semiconductor (CMOS) designs in advanced semiconductor-on-insulator technology platforms (e.g., a fully-depleted silicon-on-insulator technology platform) include, but are not limited to, field effect transistor (FET) size scaling and optional back gate biasing to improve performance (e.g., forward back-biasing (FBB) or reverse back-biasing (RBB) for fine tuning FET threshold voltages (Vts). However, due to increased resistance from the ultra-thin semiconductor layer, raised source/drain regions are necessary to boost saturation current. Unfortunately, the raised source/drain regions result in a corresponding performance-degrading increase in overlap capacitance (Coy) between the raised source/drain regions and the gate structure.

In view of the foregoing, disclosed herein are embodiments of a method of forming a spacer adjacent to a gate of a transistor (e.g., PFET or NFET) having a thicker spacer near an upper portion of the gate and a thinner spacer near a lower portion of the gate. An epitaxial semiconductor layer (e.g., raised source/drain epi) may be formed closer to the lower portion of the gate, resulting in performance enhancement while the thicker spacer near the upper portion of the gate keeps the epitaxial semiconductor layer further from the gate, reducing overlap capacitance (Coy). The transistor may be a FET, preferably a PFET since it would get more benefit from the invention. In the method, a spacer is formed along a sidewall of the gate and a bottom portion of the spacer is removed to provide a larger area for the epitaxial semiconductor for the source/drain regions to grow near the lower portion of the gate/gate spacer.

Referring now to the drawings, FIG. 1 is a cross-section diagram illustrating disclosed embodiments of a semiconductor structure 12. The semiconductor structure 12 can include a semiconductor substrate 14. In some embodiments, the semiconductor substrate 14 could be a semiconductor layer of a semiconductor-on-insulator structure (e.g., a silicon layer of a silicon-on-insulator (SOI) structure), as illustrated. Alternatively, the semiconductor layer could be a bulk semiconductor substrate (e.g., a bulk silicon substrate) although other substrate materials are contemplated herein. In some embodiments, the semiconductor substrate 14 can be a monocrystalline semiconductor substrate. An insulator material 16 can be bonded to the semiconductor substrate 14. In some embodiments, the insulator material 16 can be $SiO_2$, although other insulator materials are also contemplated herein. The insulator material 16 can be a silicon dioxide layer (also referred to herein as a buried oxide layer that is relatively thin (e.g., 50 nm or less). A semiconductor layer 18 can be formed on the insulator material 16. The semiconductor layer 18 can be a monocrystalline silicon layer or some other suitable monocrystalline semiconductor layer (e.g., a monocrystalline silicon germanium layer) that is also relatively thin (e.g., 22 nm or less) to form SOI technology based devices.

The semiconductor structure 12 can, for example, be formed using an advanced semiconductor-on-insulator technology platform (e.g., a fully depleted silicon-on-insulator (FDSOI) technology platform). Those skilled in the art will recognize that, in advanced semiconductor-on-insulator technology platforms such as in the FDSOI technology platform, a semiconductor structure is typically formed on a hybrid semiconductor substrate. Such a hybrid semiconductor substrate typically includes a base semiconductor substrate, which is monocrystalline in structure, and both semiconductor-on-insulator regions (e.g., SOI regions) and bulk semiconductor regions (also referred to as hybrid semiconductor regions), on the base semiconductor substrate. Each semiconductor-on-insulator region includes a monocrystalline semiconductor layer on an insulator layer above the base semiconductor substrate. In some technologies, the bulk semiconductor region can include a monocrystalline epitaxial semiconductor layer (e.g., a monocrystalline silicon layer) immediately adjacent to the top surface of the base semiconductor substrate. Top surfaces of the epitaxial semiconductor layers in the bulk semiconductor regions and top surface of SOI layers in the semiconductor-on-insulator regions can be essentially co-planar. Alternatively, top surfaces of epitaxial semiconductor layers in the bulk semiconductor regions can be somewhat above or below the level of the top surface of SOI layers in the semiconductor-on-insulator regions. Those skilled in the art will recognize that in advanced semiconductor-on-insulator technology platforms (e.g., the fully depleted silicon-on-insulator (FDSOI) technology platform) the semiconductor-on-insulator regions are typically used as devices regions (e.g., for fully depleted planar field effect transistors (FET)). Bulk semiconductor regions can provide a means for accessing well regions below the device regions so that the well regions can be selectively biased (e.g., forward back biasing (FBB) or reverse back biasing (RBB) to adjust the threshold voltages (Vts) of the above FETs)). Bulk semiconductor regions can also be used as additional device regions. Since the present invention is directed to a FET structure, such bulk semiconductor regions have been omitted from the drawings to avoid clutter and allow the reader to focus on the salient aspects of the disclosed embodiments.

The semiconductor structure 12 can further include a first device 20 (e.g., a PFET device). The first device 20 can include a gate 22 and a gate sidewall spacer 24. The gate sidewall spacer 24 can have a first section 26 on the semiconductor layer 18 and positioned laterally adjacent to the gate 22 and further having a second section 28 above and wider than the first section 26 and positioned laterally adjacent to the gate 22. That is, the gate sidewall spacer 24 can be a multi-layered spacer including: a first spacer layer 64 position laterally immediately adjacent to and essentially covering a sidewall of the gate 22 such that a lower portion of the first spacer layer 64 forms the first section 26 of the gate sidewall spacer 24 and an upper portion is above the lower portion; a first material layer 66 can be positioned laterally immediately adjacent to only the upper portion of the first spacer layer 64; and a second material layer 68 can be positioned laterally adjacent to the first material layer 66 such that that upper portion of the first spacer layer 64, the first material layer 66, and the second material layer 68 form the second section 28 of the gate sidewall spacer 24. As illustrated, bottom ends of the first and second material layers 66, 68 can be at approximately the same level above a bottom end of the first spacer layer 64. These three layers 64, 66, 68 can be made of two or more different materials. For example, the first spacer layer 64 can be made of low-k dielectric materials, such as SiN or SiBCN, or SiOCN, the first material layer 66 can be made of an insulator material such as $SiO_2$, and the second material layer 68 can be made of a dielectric spacer material, such as $Si_3N_4$ or $Si_2N_2O$. Additionally, these three layers 64, 66, 68 can have the same thicknesses or different thicknesses. For example, as illustrated, the first spacer layer 64 and second material layer 68 can be relatively thin as compared to the first material layer 66. Source/drain regions 30 for the first device 20 can be epitaxially grown on the semiconductor layer 18 and positioned laterally adjacent to the first section 26 and the second section 28 of the gate sidewall spacer 24.

Optionally, the semiconductor structure 12 can further include a second device 32 (e.g., an NFET device). The second device 32 can include a gate 34 and a gate sidewall spacer 36. Source/drain regions 38 for the second device 32 can be epitaxially grown on the semiconductor layer 18 and positioned laterally adjacent to the gate 34. In some embodiments, the semiconductor layer 18 can be in a fully depleted SOI technology, which can be, e.g., SiGe for a P-type field effect transistor (PFET device) formed on the PFET region 40 of the semiconductor substrate 14 or fully depleted silicon (at least in the channel region) for an N-type field effect transistor (NFET device) formed on the NFET region 42 of the semiconductor substrate 14, as discussed below.

An isolation region 44, such as a shallow trench isolation (STI) region or some other suitable isolation region, can be formed between the PFET device 20 and the NFET device 32. In some embodiments, the isolation region 44 may be formed by conventional lithography, etching, and deposition processes such that no further explanation is required for a complete understanding of the present disclosure. For example, a resist formed over the semiconductor layer 18 is exposed to energy (light) to form a pattern (opening). An etching process with a selective chemistry, e.g., reactive ion etching (RIE), can be used to form an opening in the semiconductor layer 18 through the openings of the resist. The resist is then removed by a conventional oxygen ashing process or other known stripants. An oxide can be deposited within the opening, followed by a planarization process, e.g., chemical mechanical planarization (CMP). The deposition of the oxide can be a conventional deposition process, e.g., chemical vapor deposition (CVD) process.

Figure 2:
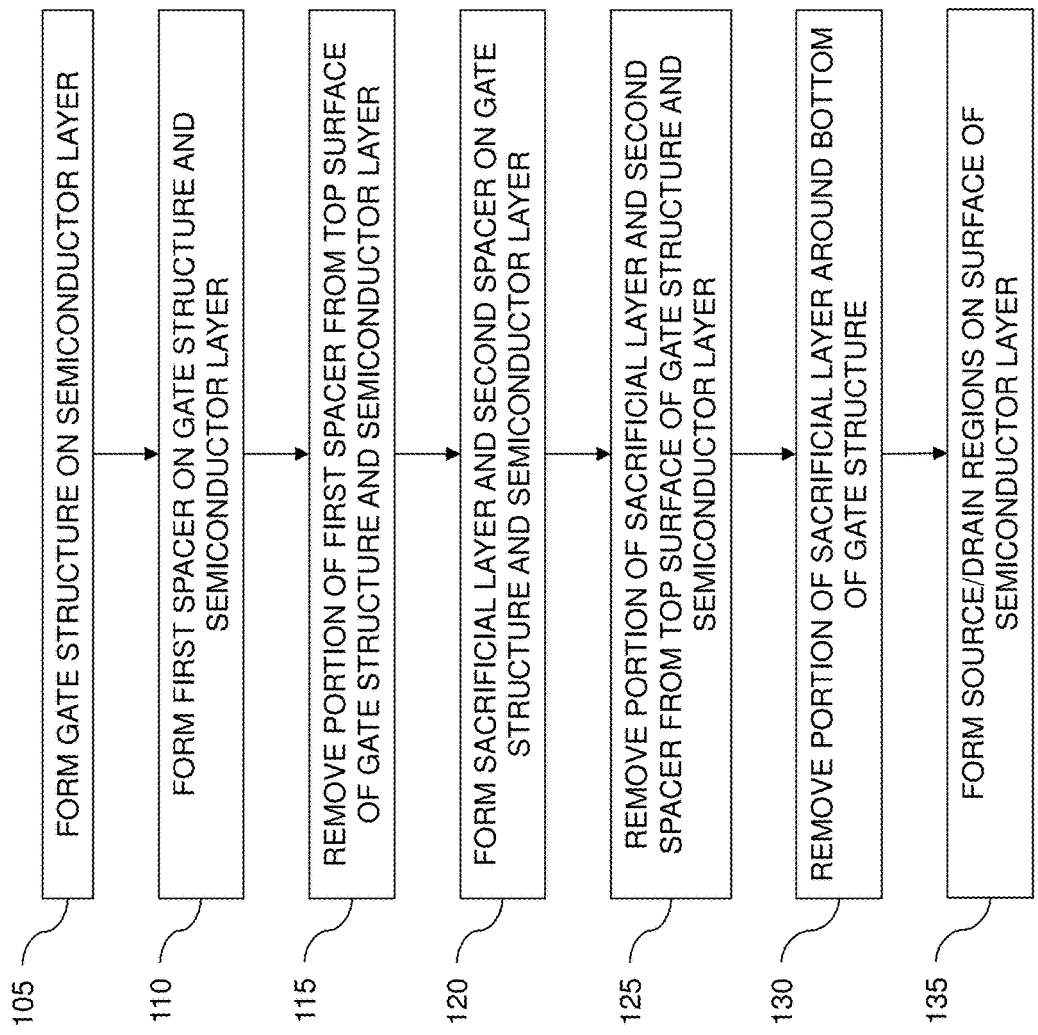
FIG. 2 is a flow diagram illustrating method embodiments for forming a first part of the disclosed semiconductor structure embodiments.

FIG. 2 is a flow diagram illustrating a method of forming a semiconductor structure 12 according to the present invention.

Figure 3:
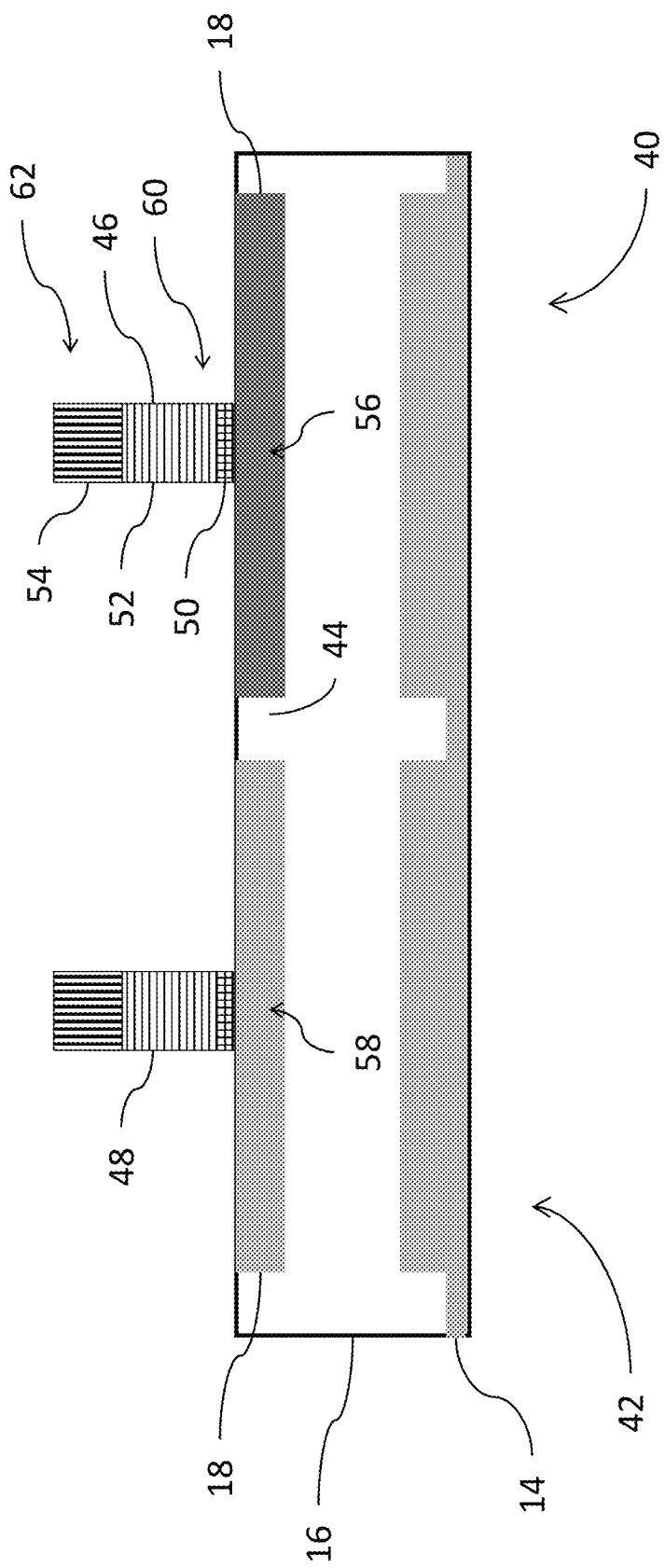
FIG. 3 is a cross-section diagram illustrating partially completed semiconductor structures formed according to the flow diagram of FIG. 2.

At 105 of FIG. 2, gate structures 46, 48 are formed on the semiconductor layer 18 for a PFET device 20 and an NFET device 32. The gate structure 46 is for a PFET device 20 and the gate structure 48 is for the NFET device 32. As shown in FIG. 3, the gate structures 46, 48 can be formed by gate first processes using conventional deposition, lithography and etching processes such that no further explanation is required for a complete understanding of the present disclosure. In some embodiments, the gate structures 46, 48 can include a gate dielectric layer 50, one or more gate conductor layers 52 formed above the gate dielectric layer 50, and a gate capping layer 54 (e.g., a silicon nitride cap layer). These gate layers can subsequently be lithographically patterned and etched to form the gate structures 46, 48 on the layer of semiconductor layer 18 above a channel region 56 for the PFET device 20 and channel region 58 for the NFET device 32. With particular reference to the gate structure 46 for the PFET device 20, the gate structure 46 has a bottom section 60 and a top section 62.

Figure 4:
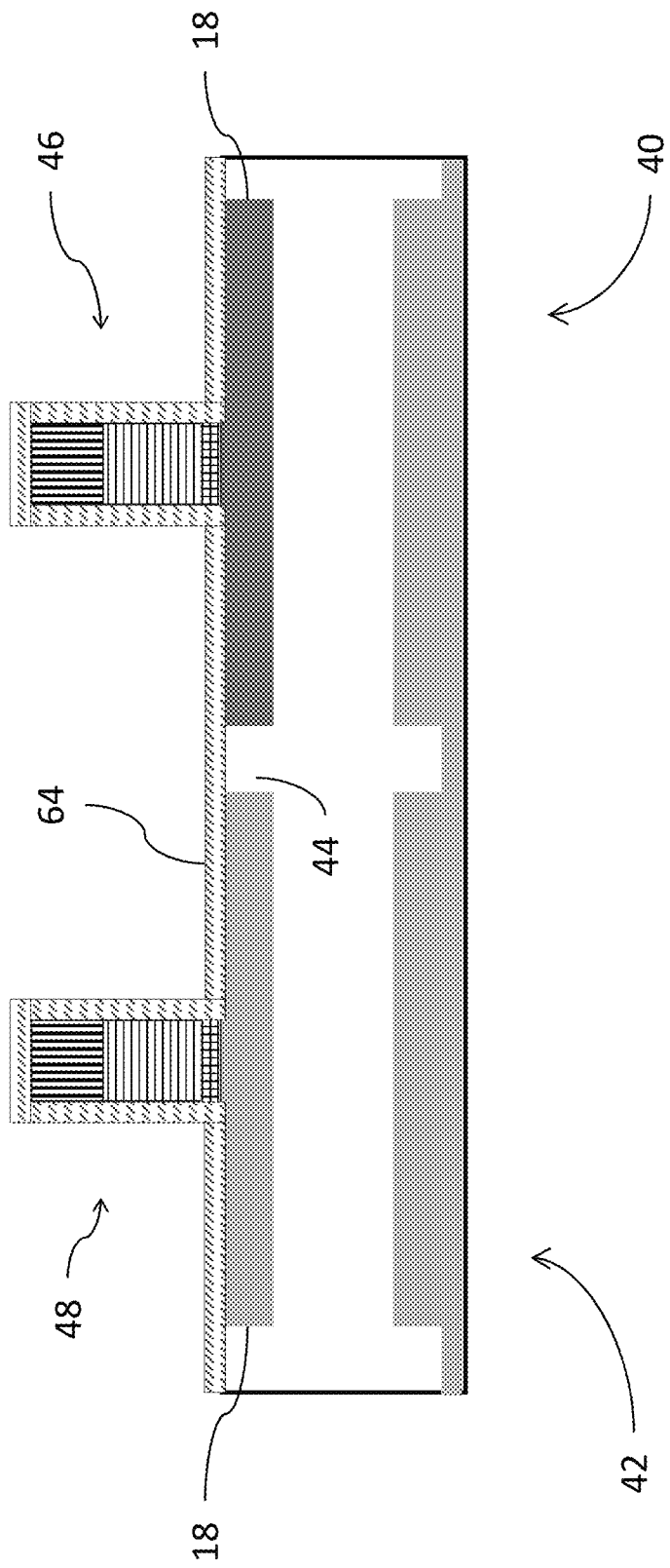
FIG. 4 is a cross-section diagram illustrating partially completed semiconductor structures formed according to the flow diagram of FIG. 2.

At 110 of FIG. 2, a first spacer layer 64 is formed over the gate structures 46, 48 and adjacent regions, as shown in FIG. 4. The first spacer layer 64 can be composed of low-k materials, such as SiN or SiBCN (with B reducing the permittivity of the K value) or SiOCN. The first spacer layer 64 can be relatively thin (e.g., 6 nm or less), which can be deposited by a conventional deposition process, e.g., atomic layer deposition (ALD) process to a thickness of about 6 nm; although other dimensions are contemplated herein depending on the particular technology nodes and/or design parameters.

Figure 5:
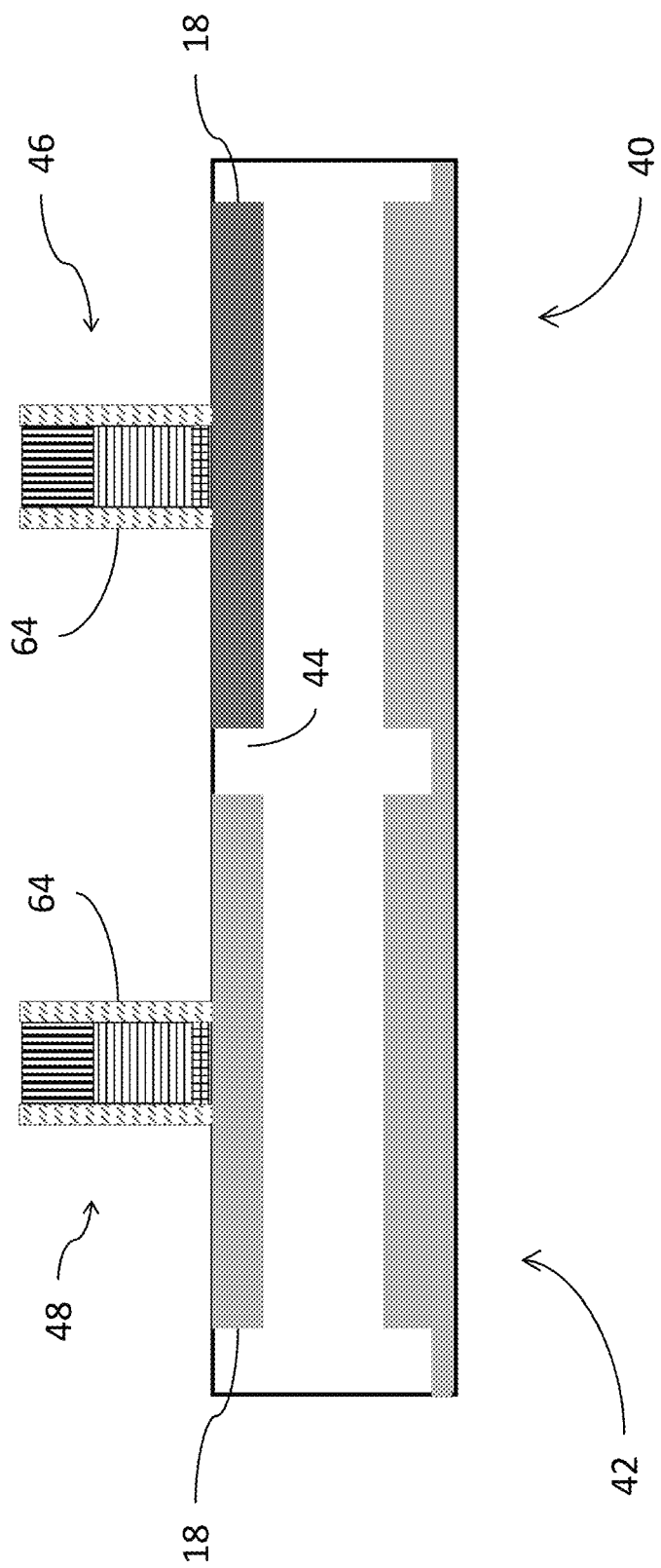
FIG. 5 is a cross-section diagram illustrating partially completed semiconductor structures formed according to the flow diagram of FIG. 2.

At 115 of FIG. 2, the first spacer layer 64 is removed from the top surface of the gate structures 46, 48 and adjacent regions, as shown in FIG. 5, using conventional etching processes. This leaves a portion of the first spacer layer 64 on the sidewalls of gate structures 46, 48.

Figure 6:
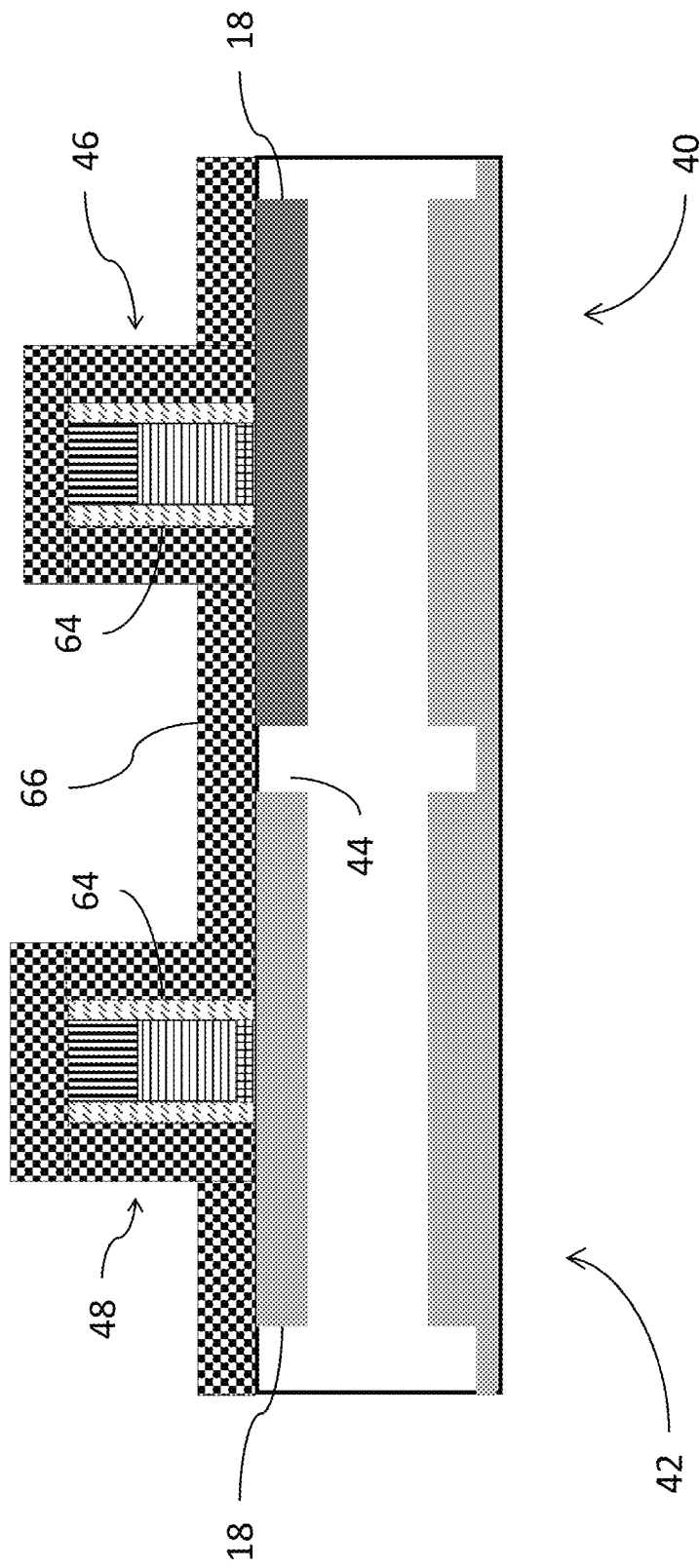
FIG. 6 is a cross-section diagram illustrating partially completed semiconductor structures formed according to the flow diagram of FIG. 2.
Figure 7:
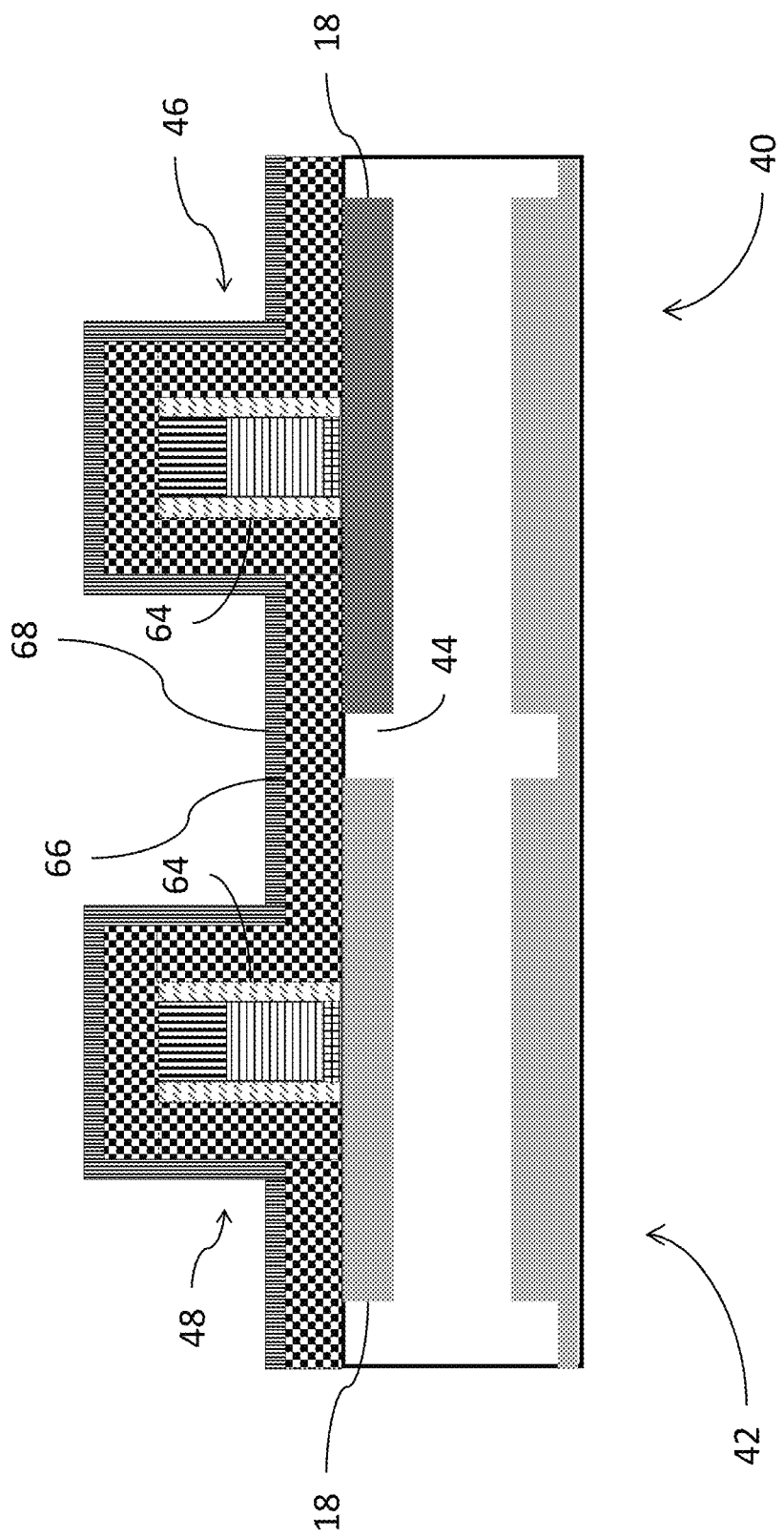
FIG. 7 is a cross-section diagram illustrating partially completed semiconductor structures formed according to the flow diagram of FIG. 2.

At 120 of FIG. 2, a bi-level spacer stack is formed around the gate structures 46, 48, over the portion of the first spacer layer 64 on the sidewalls, and on adjacent regions. For example, a first material layer 66 is deposited on the gate structures 46, 48, as shown in FIG. 6, followed by a second material layer 68, as shown in FIG. 7. In some embodiments, the first material layer 66 is an insulator material, which can be made of a sacrificial material, such as a relatively thin oxide layer (e.g., 6 nm or less) that can be removed during an epi pre-clean process; and the second material layer 68 is a spacer layer, which can be made of a relatively thin layer of nitride (e.g., 3 nm or less). It should be noted that the first material layer 66 should be sufficiently different from the second material layer 68 so as to allow selective etching of the insulator material during subsequent processing. Thus, for example, if the insulator material is a silicon dioxide layer, then the spacer material layer could be silicon nitride, silicon oxynitride, or some other suitable dielectric material different from silicon dioxide. The first material layer 66 and the second material layer 68 can be deposited by a conventional deposition process, e.g., atomic layer deposition (ALD) process to a thickness of about 4 nm; although other dimensions are contemplated herein depending on the particular technology nodes and/or design parameters.

Figure 8:
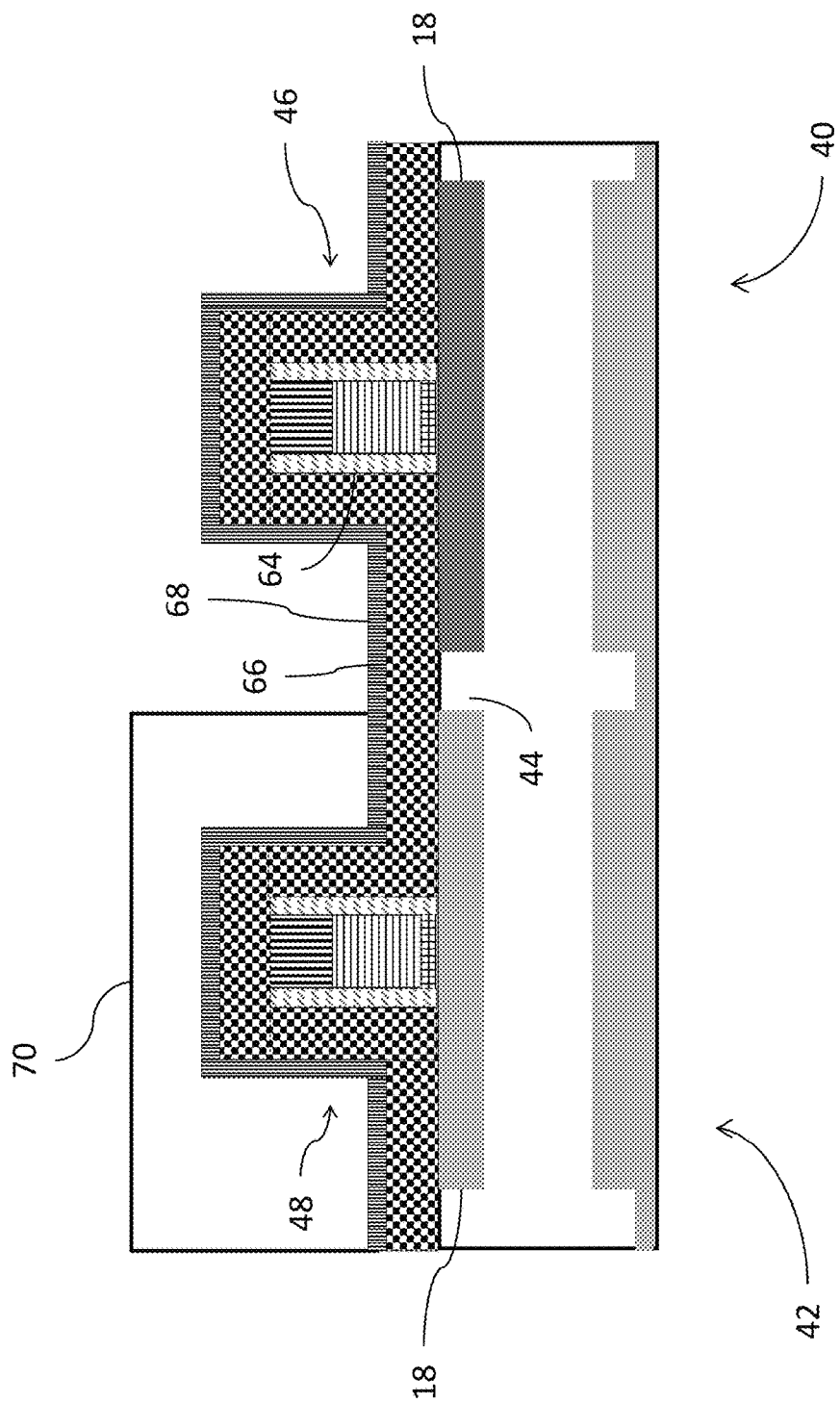
FIG. 8 is a cross-section diagram illustrating partially completed semiconductor structures formed according to the flow diagram of FIG. 2.

In FIG. 8, a first masking material 70 is deposited on the semiconductor structure 12 over the NFET region 42 and subsequently patterned, using conventional lithography and etching processes. The first masking material 70 can be any conventional resist stack including, as an example, any material that is selective to the first material layer 66 and the second material layer 68.

Figure 9:
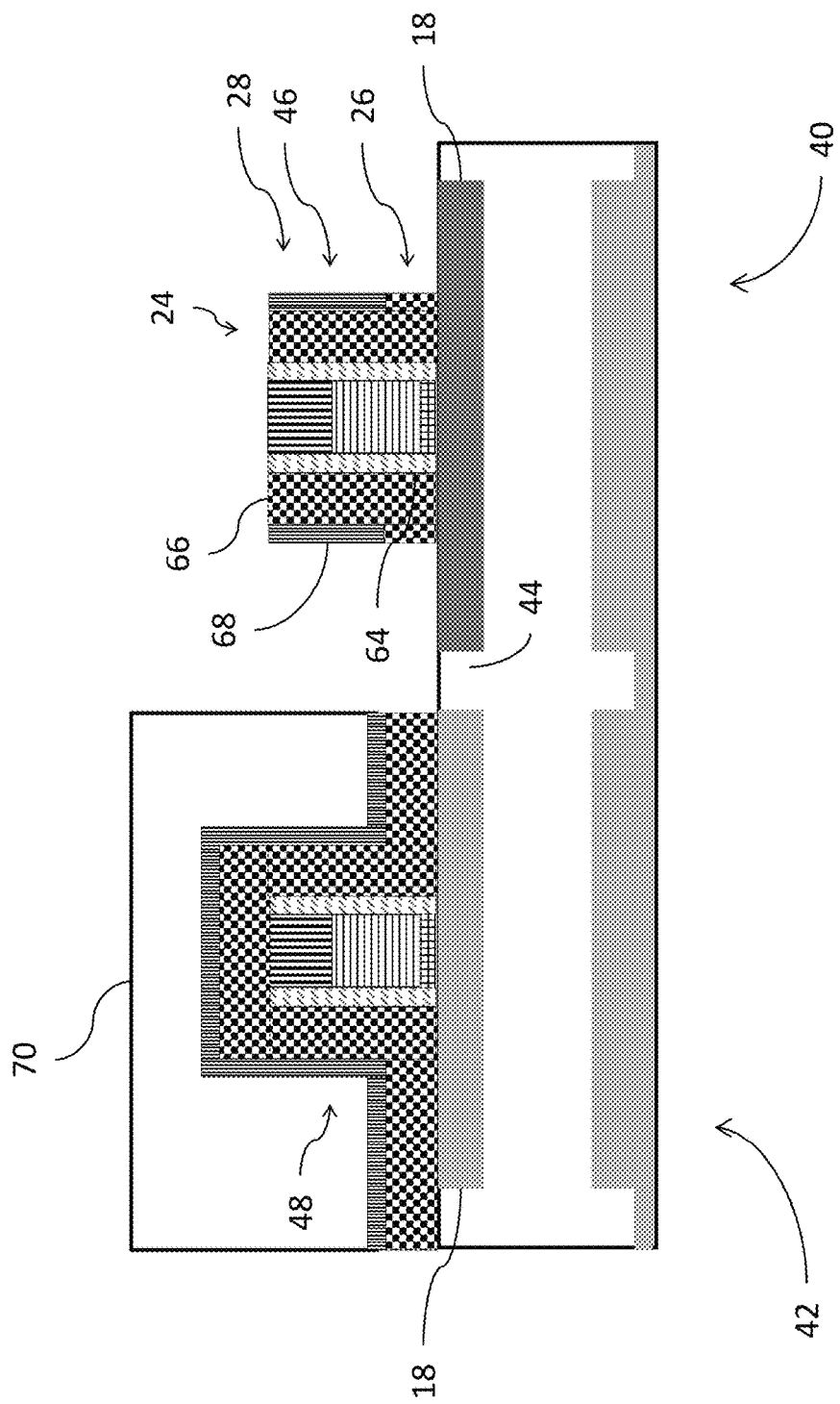
FIG. 9 is a cross-section diagram illustrating partially completed semiconductor structures formed according to the flow diagram of FIG. 2.

At 125 of FIG. 2, the first material layer 66 and the second material layer 68 are exposed on the PFET region 40, and are subjected to an etching process. That is, an etching process with a selective chemistry, e.g., reactive ion etching (RIE), can be performed to remove portions of the first material layer 66 and the second material layer 68 from horizontal surfaces, leaving a portion of the materials intact as sidewall spacers on essentially vertical surfaces of gate structure 46, as shown in FIG. 9.

Figure 10:
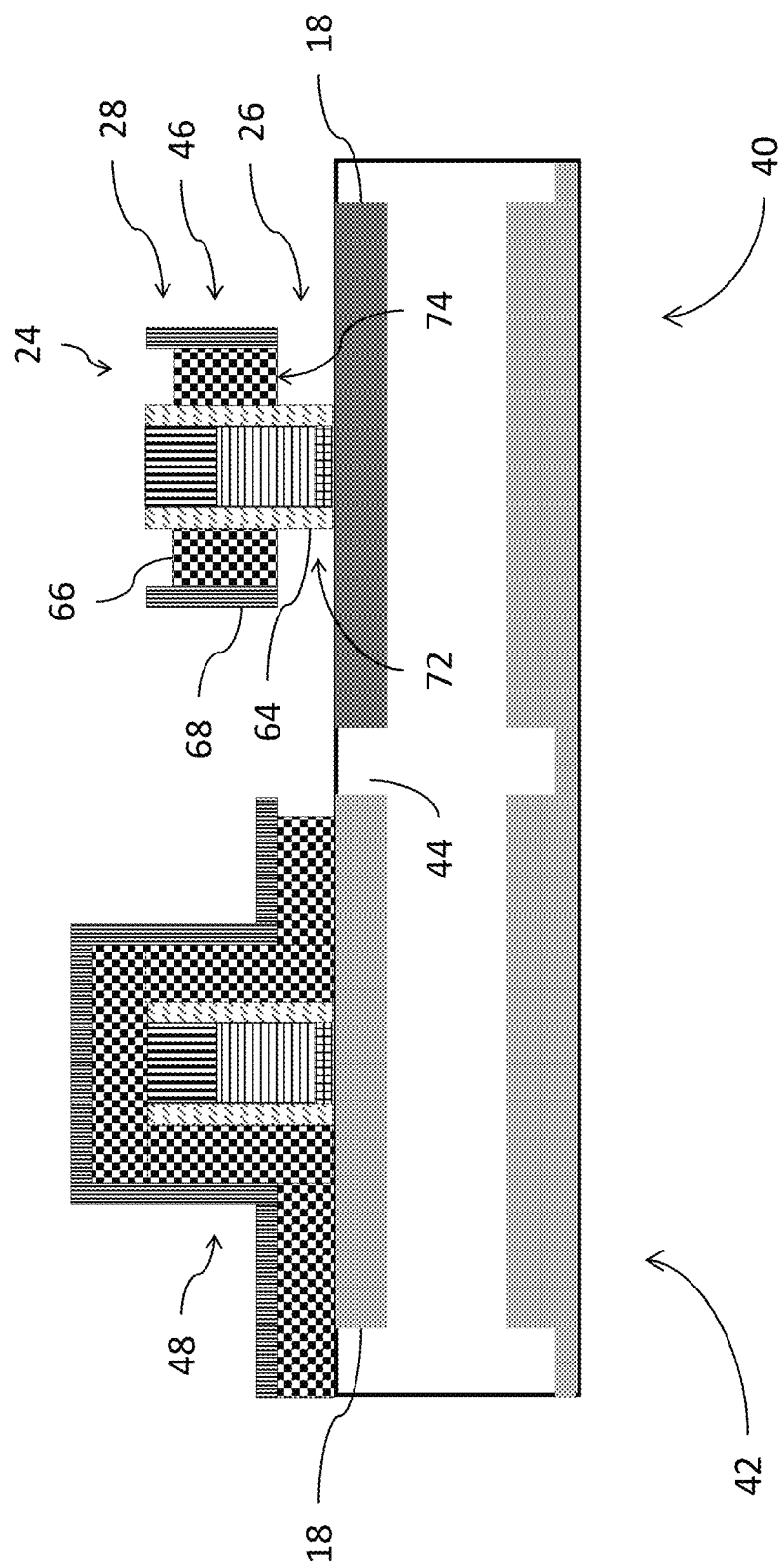
FIG. 10 is a cross-section diagram illustrating partially completed semiconductor structures formed according to the flow diagram of FIG. 2.

As shown in FIG. 10, the first masking material 70 can be removed from the NFET region 42 using conventional stripants. Following the removal of the first masking material 70, at 130 of FIG. 2, at least a portion of the first material layer 66 that is laterally adjacent to the bottom section 60 of the gate structure 46 can be removed with a cleaning process using conventional methods such as standard RCA clean (SC1/SC2), HF or SiCoNi. The cleaning process leaves two levels of sidewall spacer on the gate structure 46. The first section 26 of the gate sidewall spacer 24 is the lower level composed of a portion of the first spacer layer 64 that is contacting the bottom section 60 of the gate structure 46. The second section 28 of the gate sidewall spacer 24 is the upper level composed of a portion of the first material layer 66 and the second material layer 68 that is contacting the top section 62 of the gate structure 46. The first section 26 of the gate sidewall spacer 24 contacting the bottom section 60 of the gate structure 46 is thinner than the second section 28 of the gate sidewall spacer 24 contacting the top section 62 of the gate structure 46. In other words, the gate sidewall spacer 24 has a first section 26 on the semiconductor layer and positioned laterally adjacent to the gate structure 46 and a second section 28 above and wider than the first section 26 and positioned laterally adjacent the gate structure 46. The cleaning process leaves a space 72 between the semiconductor layer 18 and a bottom surface 74 of an outer edge portion of the second section 28 of the gate sidewall spacer 24 that extends laterally beyond the first section 26 of the gate sidewall spacer 24.

Figure 11:
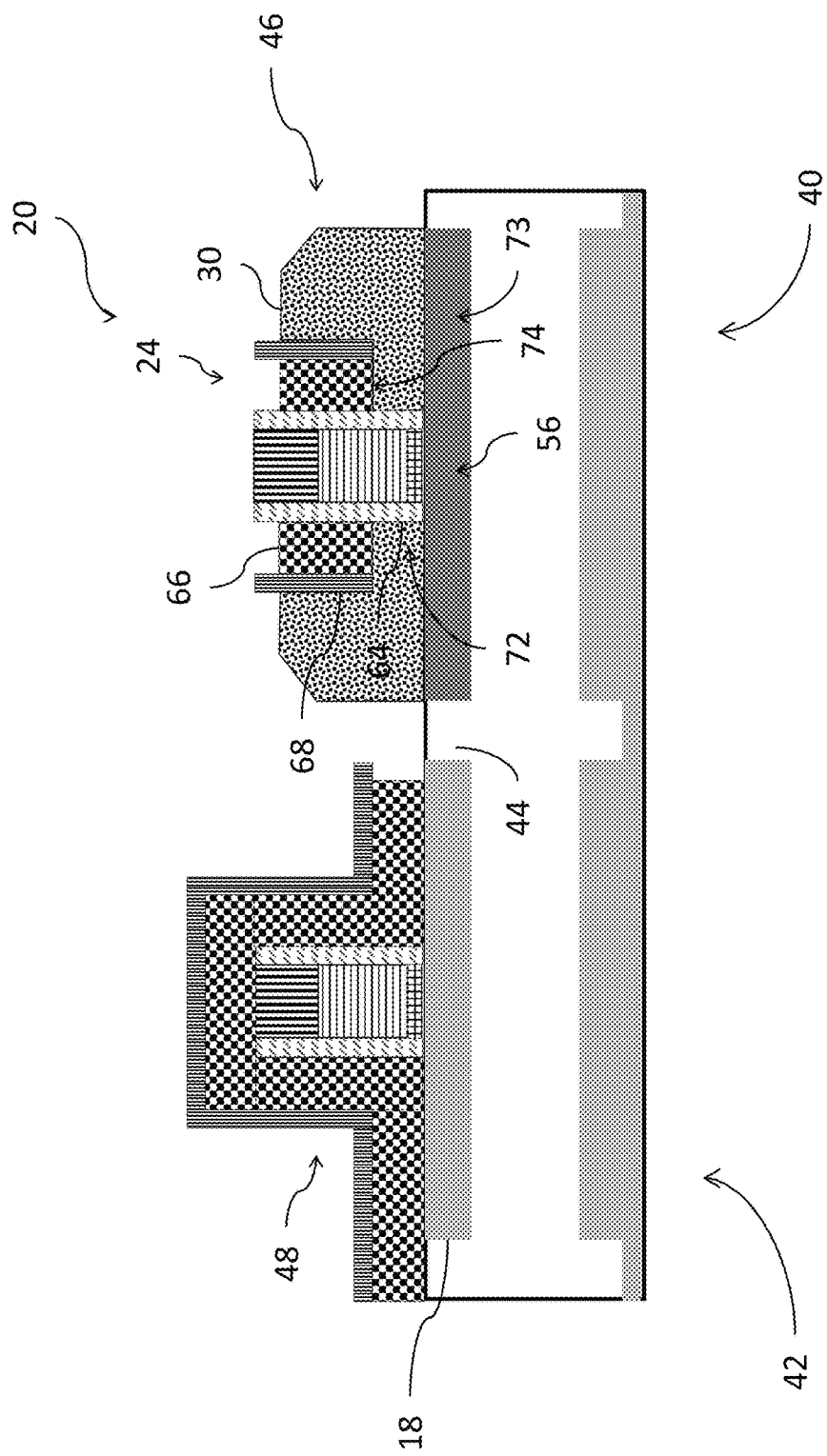
FIG. 11 is a cross-section diagram illustrating partially completed semiconductor structures formed according to the flow diagram of FIG. 2.

At 135 of FIG. 2, raised source/drain regions 30 are epitaxially grown on the exposed surface of the semiconductor layer 18 e.g., over the source and drain diffusion areas 73 for the PFET device 20, as shown in FIG. 11. In some embodiments, to form the source/drain regions 30, a layer of monocrystalline semiconductor material can be in situ doped and concurrently and selectively epitaxially grown from the exposed surfaces of the semiconductor layer 18. In the case of the PFET, the channel region 56 can be undoped or low doped so as to have N-conductivity at a relatively low conductivity level and the source/drain regions 30 can be doped so as to have P-type conductivity at a relatively high conductivity level (e.g., so as to be P+ source/drain regions).

The source/drain regions 30 of the present disclosure can be manufactured in a number of ways using a number of different tools. In general, though, the methodologies and tools are used to form structures with dimensions in the micrometer and nanometer scale. The methodologies, i.e., technologies, employed to manufacture the epitaxial source/drain regions of the present disclosure have been adopted from integrated circuit (IC) technology. For example, the structures are built on wafers and are realized in films of material patterned by photolithographic processes on the top of a wafer. In particular, the fabrication of the epitaxial source/drain regions uses three basic building blocks: (i) deposition of thin films of material on a substrate, (ii) applying a patterned mask on top of the films by photolithographic imaging, and (iii) etching the films selectively to the mask.

In an embodiment, the source/drain regions 30 are unfaceted and contact the first section 26 of the gate sidewall spacer 24 and the second section 28 of the gate sidewall spacer 24 adjacent to the gate structure 46. The first section 26 of gate sidewall spacer 24 allows the source/drain regions 30 to be formed closer to the bottom section 60 of the gate structure 46, resulting in performance enhancement of the PFET device 20, while the second section 28 of gate sidewall spacer 24 near the top section 62 of the gate structure 46, being thicker, keeps the source/drain regions 30 further from the gate structure 46, reducing overlap capacitance (Coy) due to the extra space provided between the source/drain regions 30 from the gate structure 46. The source/drain regions 30 completely fill the space 72 between the semiconductor layer 18 and a bottom surface 74 of the outer edge portion of the second section 28 of the gate sidewall spacer 24, which extends laterally beyond the first section 26 of the gate sidewall spacer 24. In some embodiments, the epitaxial material can be Si or SiGe material, for example.

Figure 12:
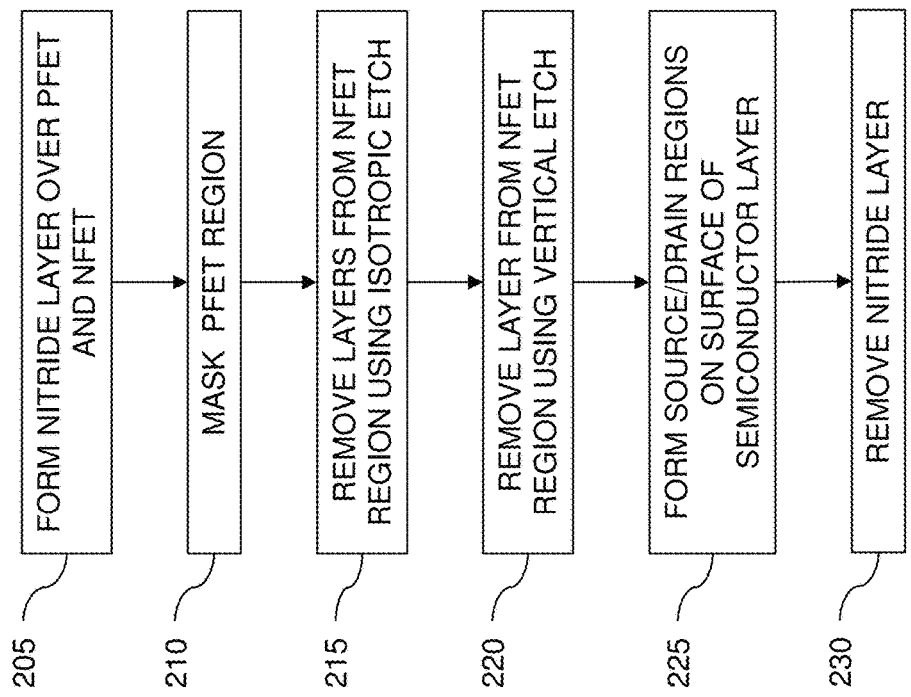
FIG. 12 is a flow diagram illustrating method embodiments for forming a second part of the disclosed semiconductor structure embodiment.

FIG. 12 is a flow diagram illustrating additional method steps for forming a semiconductor structure according to the present invention.

Figure 13:
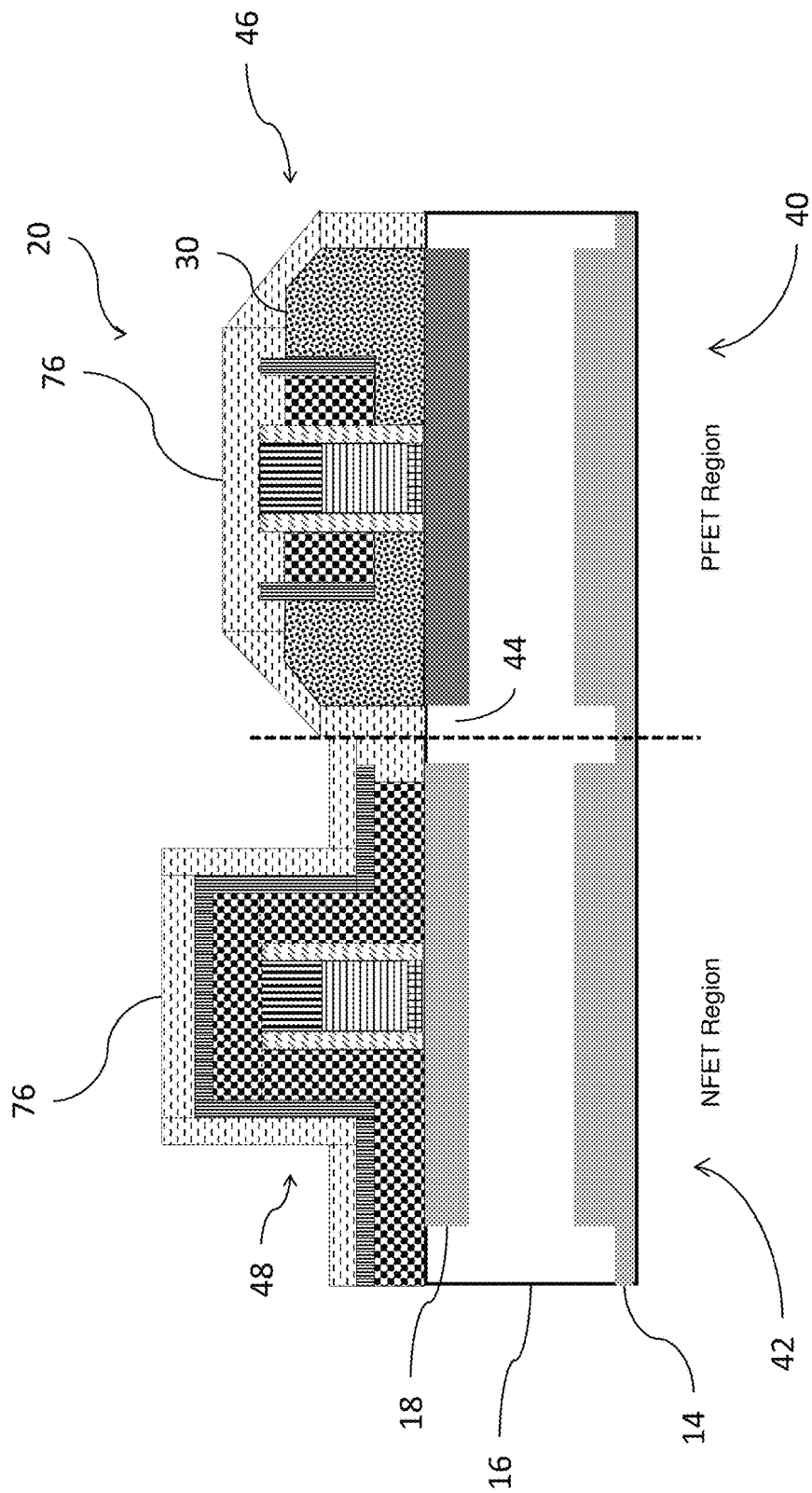
FIG. 13 is a cross-section diagram illustrating partially completed semiconductor structures formed according to the flow diagram of FIG. 12.

At 205 of FIG. 12, a nitride layer 76 is formed over the structures on the PFET region 40 and the NFET region 42, as shown in FIG. 13. The nitride layer 76 can be a layer, such as SiN, SiBCN, or SiOCN. The nitride layer 76 can be relatively thin (e.g., 4 nm or less), which can be deposited by a conventional deposition process, e.g., atomic layer deposition (ALD) process to a thickness of about 6 nm; although other dimensions are contemplated herein depending on the particular technology nodes and/or design parameters.

Figure 14:
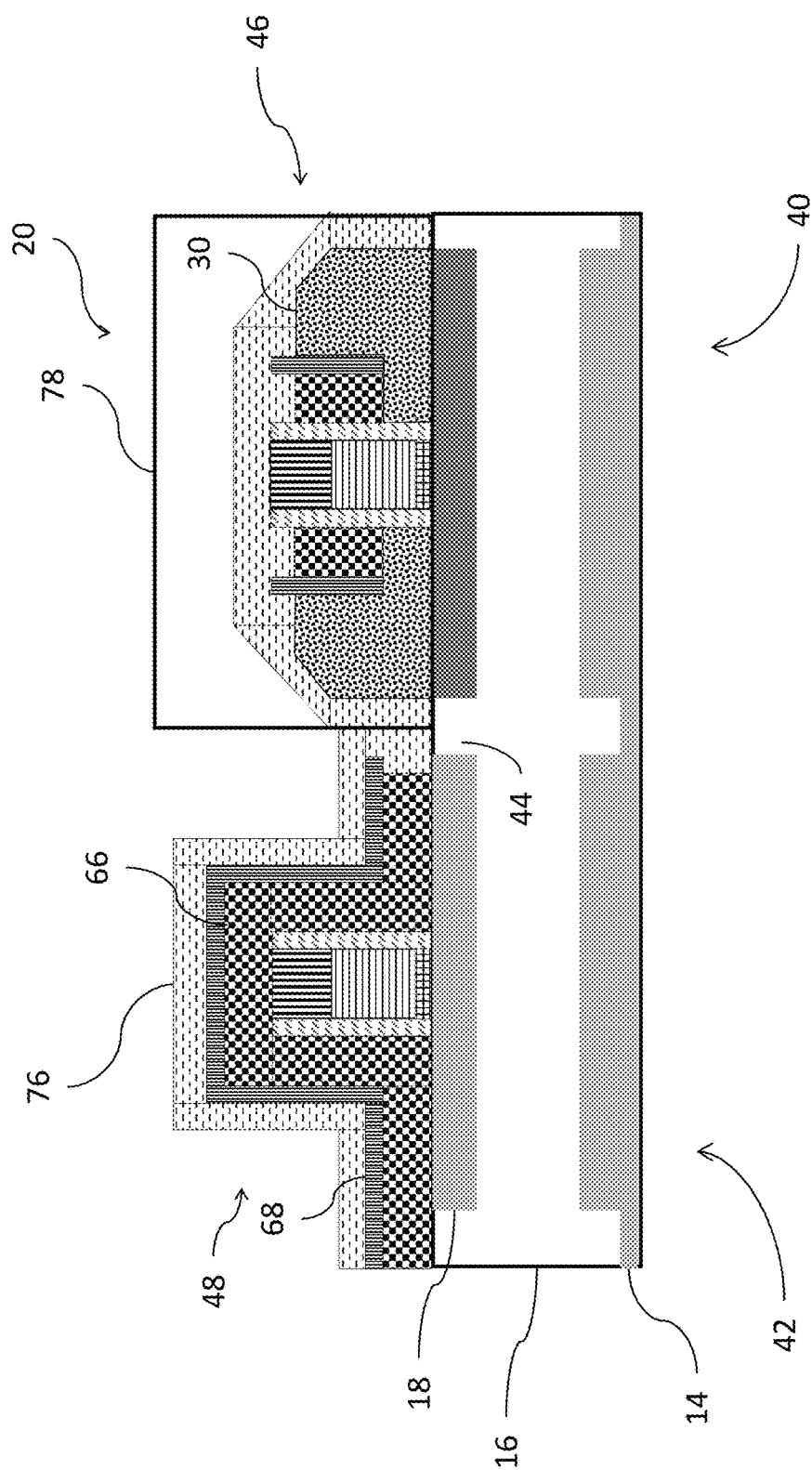
FIG. 14 is a cross-section diagram illustrating partially completed semiconductor structures formed according to the flow diagram of FIG. 12.

At 210 of FIG. 12, a second masking material 78 is deposited on the PFET region 40, as shown in FIG. 14. The second masking material 78 can be any conventional resist stack including, as an example, any material that is selective to the nitride layer 76.

Figure 15:
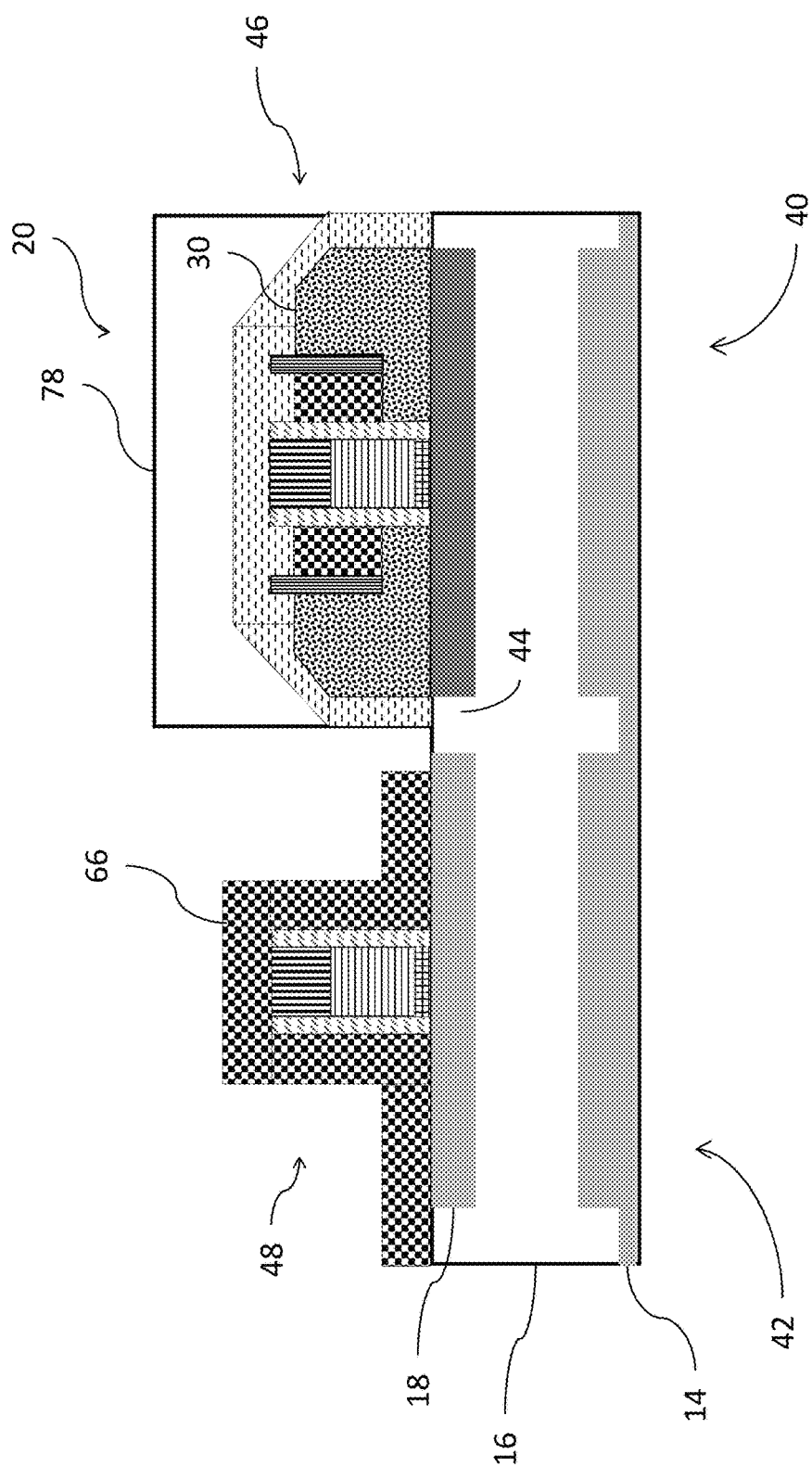
FIG. 15 is a cross-section diagram illustrating partially completed semiconductor structures formed according to the flow diagram of FIG. 12.

At 215 of FIG. 12, the nitride layer 76 and the second material layer 68 are exposed on the NFET region 42, and are subjected to an etching process, such as an isotropic etch. That is, an etching process with a selective chemistry, e.g., reactive ion etching (RIE), can be performed to remove the nitride layer 76 and the second material layer 68 from the surfaces not protected by the second masking material 78, as shown in FIG. 15.

Figure 16:
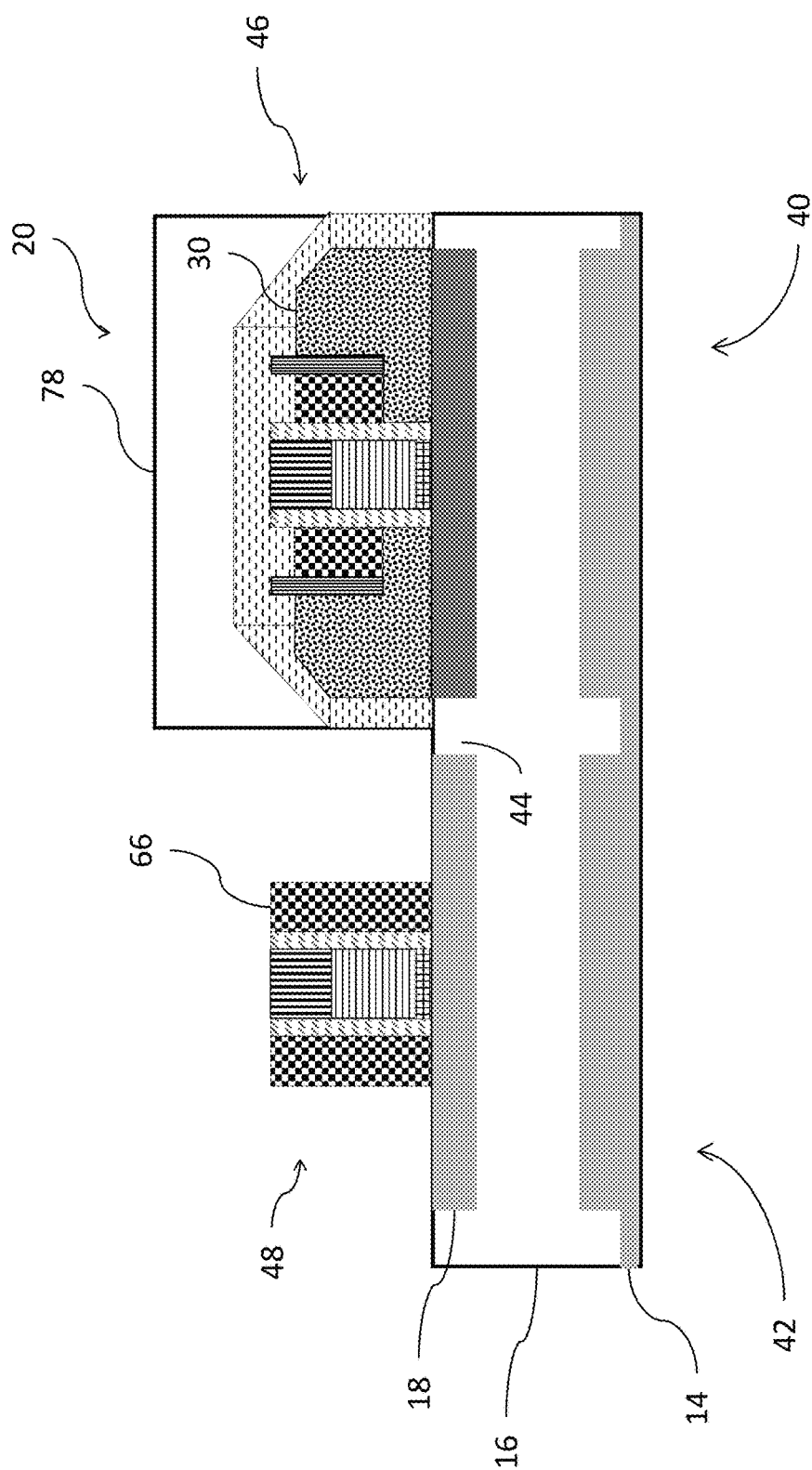
FIG. 16 is a cross-section diagram illustrating partially completed semiconductor structures formed according to the flow diagram of FIG. 12.

At 220 of FIG. 12, the first material layer 66 is exposed on the NFET region 42, and subjected to an etching process, such as a vertical etch. This etching process will expose the underlying semiconductor layer 18 around the gate structure 48 leaving a portion of the first material layer 66 intact as sidewall spacers on essentially vertical surfaces of gate structure 48. It should be understood that this process can be performed on the NFET region 42 while the PFET device 20 remains protected by the second masking material 78, as shown in FIG. 16.

Figure 17:
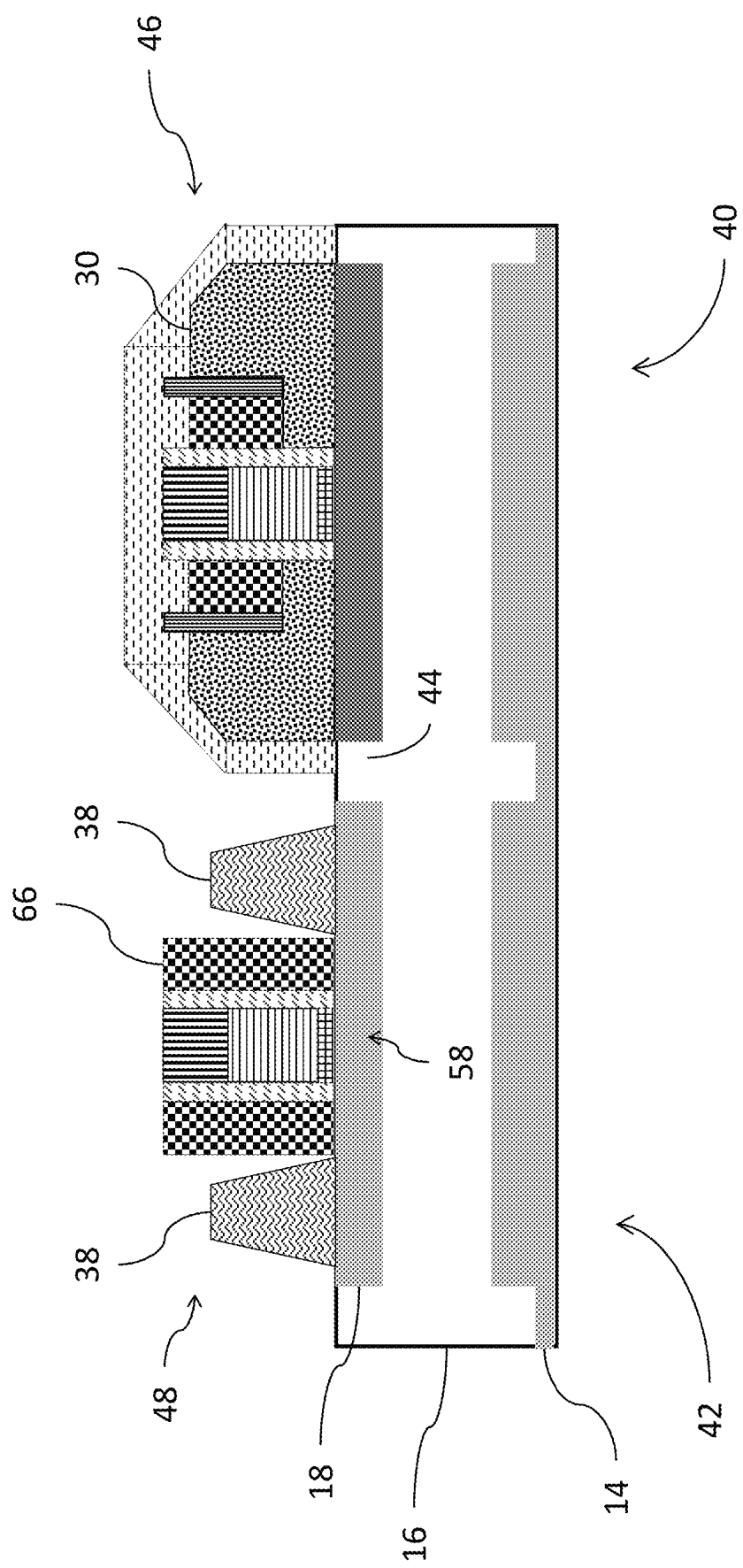
FIG. 17 is a cross-section diagram illustrating partially completed semiconductor structures formed according to the flow diagram of FIG. 12.

As shown in FIG. 17, the second masking material 78 can be removed from the PFET region 40 using conventional stripants. Following the removal of the second masking material 78, at 225 of FIG. 12, source/drain regions 38 are epitaxially grown on the exposed surface of the semiconductor layer 18. In some embodiments, to form the source/drain regions 38, a layer of monocrystalline semiconductor material can be in situ doped and concurrently and selectively epitaxially grown from the exposed surfaces of the semiconductor layer. A channel region 58 is positioned laterally between the raised source and drain regions 38. In the case of the NFET, the channel region 58 can be undoped or low doped so as to have P-conductivity at a relatively low conductivity level and the source/drain regions 38 can be doped so as to have N-type conductivity at a relatively high conductivity level (e.g., so as to be N+ source/drain regions).

Figure 18:
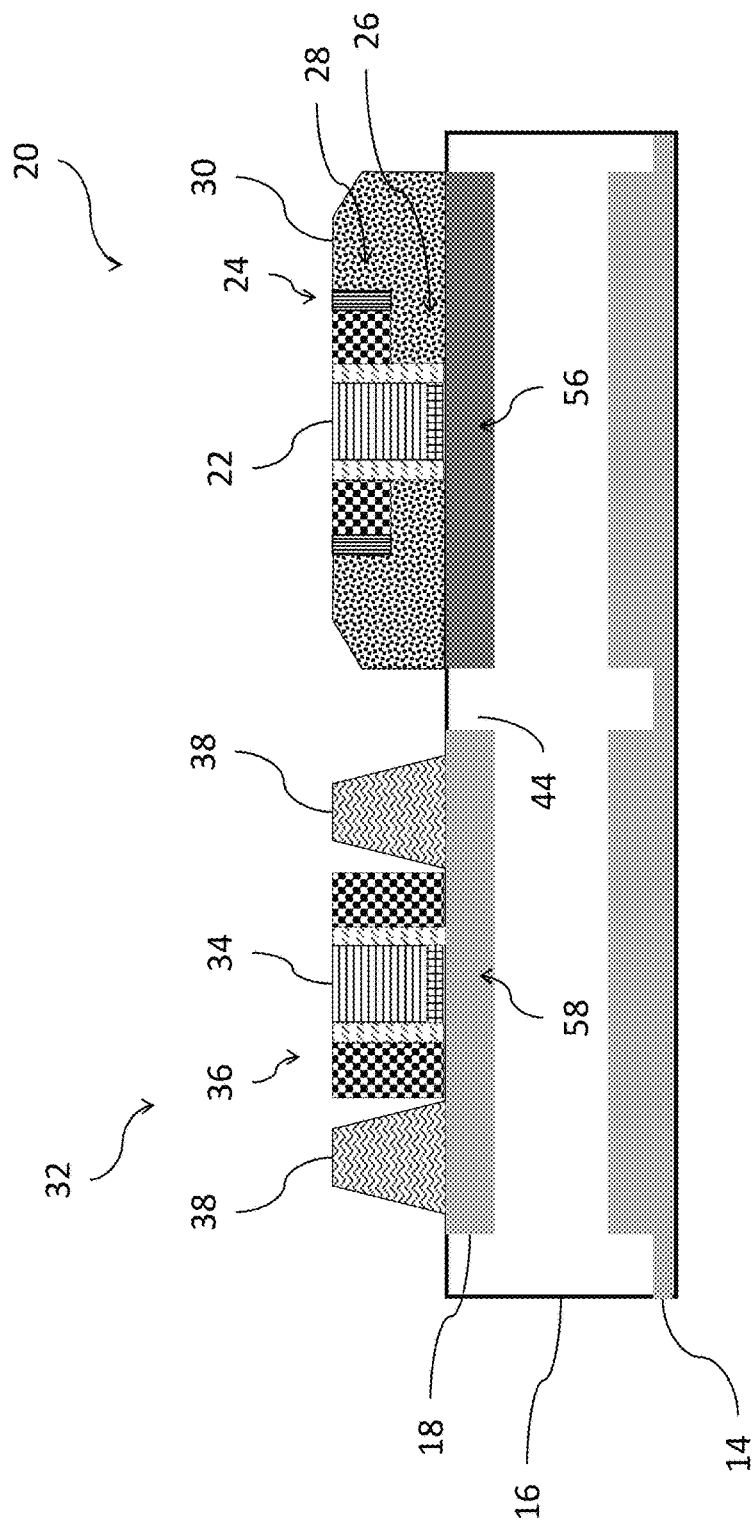
FIG. 18 is a cross-section diagram illustrating a semiconductor structure embodiment including a P-type field effect transistor (PFET) and an N-type field effect transistor (NFET).

At 230 of FIG. 12, the nitride layer 76 is removed from the PFET region 40, as shown in FIG. 18. In some embodiments, the nitride layer 76 can be removed from the PFET region 40 using a RIE. The gate capping layer 54 is then removed either with an anisotropic RIE or with a combination of sacrificial oxide spacer and isotropic nitride removal.

Referring to the flow diagrams of FIG. 2 and FIG. 12, disclosed herein are method embodiments for forming semiconductor structures, which include a planar semiconductor-on-insulator field effect transistor (FET) with a channel region positioned laterally between source/drain regions and that, in order to enhance performance, have a uniquely shaped spacer on the gate structure of, at least, the PFET device.

For purposes of this disclosure, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As), or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

As mentioned above, the structures can be an NFET (e.g., with an intrinsic or P-channel region positioned laterally between N+ source/drain regions 38 and a gate structure 48, on the channel region 58) or, alternatively, a PFET (e.g., with an intrinsic or N− channel region positioned laterally between P+ source/drain regions 30 and a gate structure 46 on the channel region 56). In either case, any suitable gate structure 46, 48 could be employed. For example, the gate stack of the gate structure 46, 48 could be a gate-first polysilicon gate stack, which includes, for example: a silicon dioxide gate dielectric layer; a doped polysilicon gate conductor layer on the silicon dioxide gate dielectric layer; and, optionally, a metal silicide layer (e.g., CoSi, NiSi, WSi, TiSi, or any other suitable metal silicide material layer) on the doped polysilicon gate conductor layer. Alternatively, the gate stack of the gate structure 46, 48 could be a gate-first high-K metal gate (HKMG) stack, which includes, for example: an interfacial layer (e.g., a silicon oxynitride layer) on the semiconductor layer; a high-K gate dielectric layer (i.e., a layer of dielectric material with a dielectric constant that is greater than 3.9 including, for example, hafnium (Hf)-based dielectrics, such as hafnium oxide, hafnium silicon oxide, hafnium silicon oxynitride, or hafnium aluminum oxide, or other suitable high-k dielectrics, such as aluminum oxide, tantalum oxide, or zirconium oxide) on the interfacial layer; one or more stacked metal layers (e.g., a metal capping layer and an additional metal material layer suitable for dipole formation on the metal capping layer) on the high-K gate dielectric layer; an optional doped polysilicon gate conductor layer on the metal gate conductor layer(s); and an optional metal silicide layer, on the doped polysilicon gate conductor layer. Alternatively, the gate stack of the gate structure 46, 48 could be any other suitable type of gate stack (e.g., a replacement metal gate (RMG) structure), which includes, for example: a high-K gate dielectric layer; a work function metal layer on the high-K gate dielectric layer; an optional doped polysilicon gate conductor layer on the work function metal layer; and an optional metal silicide layer, on the doped polysilicon gate conductor layer.

Various different gate-first and replacement gate structures are known in the art and, thus, the details of such gate structures have been omitted from this specification in order to allow the reader to focus on the salient aspects of the disclosed embodiments. However, as discussed above, those skilled in the art will recognize that the configuration of the gate stack of the gate structure 46, 48 can vary depending upon whether the FET is an NFET or a PFET. For example, the optimal effective work function for the gate structure of an NFET is between about 3.9 eV and about 4.2 eV, whereas the optimal effective work function for the gate structure of a PFET is between about 4.9 eV and about 5.2 eV. In a gate-first polysilicon gate stack, the desired effective work function can be achieved, for example, by doping the polysilicon gate conductor layer with different dopants. For example, in an NFET, the polysilicon gate conductor layer can be doped with an N-type dopant (e.g., phosphorous (P), arsenic (As) or antimony (Sb)). In a PFET, the polysilicon gate conductor layer can be doped with P-type dopant (e.g., boron (B)). In a gate-first HKMG, the desired effective work function can be achieved, for example, using different metal layers on the high-K gate dielectric layer. For example, in an NFET, the metal layers on the high-K gate dielectric layer can include a titanium nitride (TiN) capping layer and, on the TiN capping layer, a lanthanum (La) layer for optimal NFET-specific dipole formation. In a PFET, the metal layers on the high-K gate dielectric layer can include a TiN capping layer and, on the TiN capping layer, an aluminum (Al) layer for optimal PFET-specific dipole formation. In an RMG, the desired effective work function can be achieved, for example, using different work function metal layers immediately adjacent to the high-K gate dielectric layer. Exemplary metals (and metal alloys), which have a work function within the range optimal for NFET performance (i.e., between 3.9 eV and about 4.2 eV) include, but are not limited to, hafnium, zirconium, titanium, tantalum, aluminum, and alloys thereof, such as, hafnium carbide, zirconium carbide, titanium carbide, tantalum carbide, and aluminum carbide. Exemplary metals (and metal alloys), which have a work function within the range optimal for PFET performance (i.e., between about 4.9 eV and about 5.2 eV) include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). Such gate structures and the techniques for forming them are well known in the art and, thus, the details thereof have been omitted from this specification in order to allow the reader to focus on the salient aspects of the disclosed embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a semiconductor layer;
a gate structure on the semiconductor layer;
sidewall spacers adjacent to opposing sidewalls of the gate structure, wherein each sidewall spacer has a first section on the semiconductor layer positioned laterally adjacent to the gate structure and further having has a second section above and wider than the first section and positioned laterally adjacent the gate structure; and
source/drain regions on the semiconductor layer and positioned laterally adjacent to the sidewall spacers, respectively, wherein each source/drain region adjacent to a sidewall spacer includes: a first portion immediately adjacent to the first section of the sidewall spacer between the semiconductor layer and the second section of the sidewall spacer; and a second portion extending vertically from the first portion along and immediately adjacent to a side surface of the second section of the sidewall spacer.

2. The structure of claim 1, wherein the source/drain regions completely fill a space between the semiconductor layer and a bottom surface of an outer edge portion of the second section that extends laterally beyond the first section.

3. The structure of claim 1, wherein the semiconductor layer is a layer of a semiconductor-on-insulator structure.

4. The structure of claim 1, wherein the first section comprises a low-k dielectric material.

5. The structure of claim 1, wherein the second section comprises a plurality of layers of material.

6. The structure of claim 5, wherein the second section comprises layers of material comprising multiple different materials.

7. The structure of claim 6, wherein at least two of the layers of material have different thicknesses.

8. A structure comprising:
a substrate;
a first device comprising:
   a first gate structure having a bottom section contacting the substrate and a top section remote from the substrate;
   first sidewall spacers adjacent to opposing first sidewalls of the first gate structure, wherein each first sidewall spacer has a first section on the substrate positioned laterally adjacent to the first gate structure and further has a second section above and wider than the first section and positioned laterally adjacent the first gate structure;
   first source and drain regions on the substrate and positioned laterally adjacent to the first sidewall spacers, respectively, wherein each first source and drain region adjacent to a first sidewall spacer includes: a first portion immediately adjacent to the first section of the first sidewall spacer between the substrate and the second section of the first sidewall spacer; and a second portion extending vertically from the first portion along and immediately adjacent to a side surface of the second section of the first sidewall spacer;
   a first channel region in the substrate positioned laterally between the first source and drain regions; and
a second device comprising:
   a second gate structure having a bottom section contacting the substrate and a top section remote from the substrate;
   a second sidewall spacer on a sidewall of the second gate structure and extending above the substrate, wherein the second sidewall spacer is differently shaped from the first sidewall spacer;
   second source and drain regions on the surface of the substrate, the second source and drain regions being adjacent to and contacting the second sidewall spacer; and
   a second channel region in the substrate positioned laterally between the second source and drain regions.

9. The structure of claim 8, wherein the first device has a first-type conductivity and the second device has a second-type conductivity that is different from the first-type conductivity.

10. The structure of claim 8, wherein the first device is a p-type field effect transistor and the second device is an n-type field effect transistor.

11. The structure of claim 8, wherein the substrate comprises a semiconductor layer.

12. The structure of claim 11, wherein the semiconductor layer is a layer of a semiconductor-on-insulator structure.

13. The structure of claim 8, wherein the first section includes a single layer of material and the second section includes a plurality of layers of material.

14. The structure of claim 13, wherein at least two of the layers of material of the second section have different thicknesses.

15. The structure of claim 8, wherein the first source and drain regions are unfaceted.

16. The structure of claim 8, wherein the first source and drain regions completely fill a space between the substrate and a bottom surface of an outer edge portion of the portion of the first sidewall spacer contacting the top section of the first gate structure.

17. A method comprising:
forming a gate structure on a semiconductor layer;
forming sidewall spacers on opposing sidewalls of the gate structure, wherein each sidewall spacer has a first section on the semiconductor layer positioned laterally adjacent to the gate structure and further has a second section above and wider than the first section and positioned laterally adjacent the gate structure; and
forming source/drain regions on the semiconductor layer and positioned laterally adjacent to the sidewall spacers, respectively, wherein each source/drain region adjacent to a sidewall spacer includes: a first portion immediately adjacent to the first section between the semiconductor layer and the second section of the sidewall spacer; and a second portion extending vertically from the first portion along and immediately adjacent to a side surface of the second section of the sidewall spacer.

18. The method of claim 17, wherein the forming of the sidewall spacer further comprises:
forming a first spacer layer on the semiconductor layer and the gate structure;
removing a portion of the first spacer layer from the semiconductor layer and top surface of the gate structure;
forming a spacer stack on the semiconductor layer and the gate structure around the first spacer layer, the spacer stack having a first material layer and a second material layer;
removing a portion of the spacer stack from the semiconductor layer and top surface of the gate structure; and
removing at least a portion of the first material layer laterally adjacent to the first spacer layer on the gate structure.

19. The method of claim 17, wherein forming source/drain regions on the semiconductor layer comprises growing a semiconductor material from the semiconductor layer wherein the semiconductor material is unfaceted.

20. The method of claim 19, wherein the semiconductor material completely fill a space between the semiconductor layer and a bottom surface of an outer edge portion of the second section of the sidewall spacer contacting a top section of the gate structure.

* * * * *

UNITED STATES PATENT AND TRADEMARK OFFICE
CERTIFICATE OF CORRECTION

| | | |
|---|---|---|
| PATENT NO. | : 12,446,307 B2 | Page 1 of 1 |
| APPLICATION NO. | : 17/732601 | |
| DATED | : October 14, 2025 | |
| INVENTOR(S) | : George R. Mulfinger et al. | |

It is certified that error appears in the above-identified patent and that said Letters Patent is hereby corrected as shown below:

In the Claims

In Column 12, Claim 1, Line 58, delete "having" therefor.

Signed and Sealed this
Twenty-fifth Day of November, 2025

John A. Squires
*Director of the United States Patent and Trademark Office*